United States Patent
Koole et al.

(10) Patent No.: US 9,547,234 B2
(45) Date of Patent: Jan. 17, 2017

(54) IMPRINT LITHOGRAPHY APPARATUS AND METHOD

(75) Inventors: Roelof Koole, Utrecht (NL); Sander Frederik Wuister, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 321 days.

(21) Appl. No.: 12/842,266

(22) Filed: Jul. 23, 2010

(65) Prior Publication Data

US 2011/0018167 A1 Jan. 27, 2011

Related U.S. Application Data

(60) Provisional application No. 61/228,802, filed on Jul. 27, 2009.

(51) Int. Cl.
*G03F 7/00* (2006.01)
*B82Y 10/00* (2011.01)
*B82Y 40/00* (2011.01)

(52) U.S. Cl.
CPC ............. *G03F 7/0002* (2013.01); *B82Y 10/00* (2013.01); *B82Y 40/00* (2013.01)

(58) Field of Classification Search
CPC .................................................. G03F 7/0002
USPC ....................................................... 264/319
See application file for complete search history.

(56) References Cited

U.S. PATENT DOCUMENTS

| | | |
|---|---|---|
| 4,731,155 A | 3/1988 | Napoli et al. |
| 5,772,905 A | 6/1998 | Chou |
| 6,334,960 B1 | 1/2002 | Willson et al. |
| 2004/0124566 A1 | 7/2004 | Sreenivasan et al. |

(Continued)

FOREIGN PATENT DOCUMENTS

| | | |
|---|---|---|
| JP | 10-340874 | 12/1998 |
| JP | 2002-270540 | 9/2002 |

(Continued)

OTHER PUBLICATIONS

J. Haisma et al., "Mold-assisted nanolithography: A process for reliable pattern replication," J. Vac. Sci. Technol. B 14 (6), Nov./Dec. 1996, pp. 4124-4128.

(Continued)

*Primary Examiner* — Larry Thrower
(74) *Attorney, Agent, or Firm* — Pillsbury Winthrop Shaw Pittman LLP

(57) ABSTRACT

An imprint lithography apparatus is disclosed. The apparatus includes an imprint template arrangement for use in imprinting a pattern into a substrate provided with an amount of imprintable medium, a substrate holder configured to hold the substrate, and a chamber having an inlet to allow gas to flow into the chamber and an outlet to allow gas to flow out of the chamber, wherein the imprint template arrangement and the substrate holder are located within the chamber, the chamber, in use, being arranged to contain a gaseous atmosphere. The chamber may be part of a gas circulation system, the inlet and outlet of the chamber being connected to further components of the gas circulation system, the further components of the gas circulation system including: a gas circulation driver configured to drive gas around the gas circulation system; and/or a gas purification unit configured to purify the gas as it circulates around the gas circulation system.

14 Claims, 5 Drawing Sheets

(56) References Cited

U.S. PATENT DOCUMENTS

| | | | |
|---|---|---|---|
| 2005/0184436 A1* | 8/2005 | Jeong | B29C 35/0888 |
| | | | 264/496 |
| 2005/0274693 A1 | 12/2005 | Heidari et al. | |
| 2006/0043626 A1* | 3/2006 | Wu et al. | 264/101 |
| 2006/0280829 A1 | 12/2006 | Kruijt-Stegeman et al. | |

FOREIGN PATENT DOCUMENTS

| | | |
|---|---|---|
| JP | 2002-359180 | 12/2002 |
| JP | 2003-109915 | 4/2003 |
| JP | 2004-504718 | 2/2004 |
| JP | 2004-103817 | 4/2004 |
| JP | 2004-235613 | 8/2004 |
| JP | 2004-335552 | 11/2004 |
| JP | 2005-101313 | 4/2005 |
| JP | 2006-013401 | 1/2006 |
| JP | 2006-352121 | 12/2006 |
| JP | 2007-181938 | 7/2007 |
| JP | 2008-012858 | 1/2008 |
| JP | 2008-260273 | 10/2008 |
| JP | 2008-270798 | 11/2008 |
| WO | 02/067055 A2 | 8/2002 |
| WO | 2009/153925 | 12/2009 |

OTHER PUBLICATIONS

Japanese Office Action dated Feb. 28, 2012 in corresponding Japanese Patent Application No. 2010-162398.

\* cited by examiner

IMPRINT LITHOGRAPHY APPARATUS AND METHOD

This application claims priority and benefit under 35 U.S.C. §119(e) to U.S. Provisional Patent Application No. 61/228,802, entitled "Imprint Lithography Apparatus and Method", filed on Jul. 27, 2009. The content of that application is incorporated herein in its entirety by reference.

FIELD

The present invention relates to an imprint lithography apparatus and method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve contact of a patterned surface of an imprint template with a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable when the patterned surface contacts the imprintable medium. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium droplets on the surface of a substrate to be patterned.

SUMMARY

Gas pockets trapped between the patterned surface of the imprint template, and the imprintable medium can lead to the creation of defects in the pattern that is frozen in the imprintable medium. A highly diffusive, such as helium, can be used as an atmosphere in which imprinting takes place. Any trapped gas pockets may thus diffuse more rapidly into the imprintable medium, the substrate or the imprint template. This may lead to the reduction or elimination of defects formed in the patterned imprintable medium by the gas pockets. Furthermore, this may lead to an increase in throughput of the overall process, because it reduces the time taken for the imprintable medium to adopt the pattern of the imprint template during an imprint, known as the squeeze time. While the provision of an atmosphere of a highly diffusive gas in which imprinting is to take place is advantageous, the actual provision of the highly diffusive gaseous atmosphere may, in some respects, be disadvantageous. Existing apparatuses and methods for providing such a gaseous atmosphere can, for example, lead to an increase in the evaporation rate of imprintable medium. Evaporation may make imprinting more difficult. Furthermore, existing methods and apparatuses provide a gaseous atmosphere in an inefficient manner, often resulting in excessive use of the gas used to form the atmosphere. Such excessive use can lead to increase in running costs.

Accordingly, it is desirable to provide, for example, an imprint lithography apparatus and method that obviates or mitigates at least one problem of the prior art, whether identified herein or elsewhere, or which provides an alternative to an existing imprint lithography apparatus or method.

According to an aspect, there is provided an imprint lithography apparatus comprising: an imprint template arrangement for use in imprinting a pattern into a substrate provided with an amount of imprintable medium; a substrate holder configured to hold the substrate; and a chamber having an inlet to allow gas to flow into the chamber and an outlet to allow gas to flow out of the chamber, wherein the imprint template arrangement and the substrate holder are located within the chamber, the chamber, in use, being arranged to contain a gaseous atmosphere.

The chamber may form part of a gas circulation system, the inlet and outlet of the chamber being connected to further components of the gas circulation system, the further components of the gas circulation system comprising: a gas circulation driver configured to drive gas around the gas circulation system; and/or a gas purification unit configured to purify the gas as it circulates around the gas circulation system.

The chamber may have a top and a bottom, contamination with the chamber, in use, preferentially falling to the bottom of the chamber, and wherein the outlet is in connection with or forms part of the bottom of the chamber. The inlet is in connection with or forms part of top of the chamber.

The chamber may comprise a guide to guide a flow of gas within the chamber. The chamber may comprise a shield to at least partially shield the imprintable medium from a flow of gas. The guide and/or shield may be moveable.

The gas circulation system may further comprise, or be in connection with, a sensor to detect a property of the gas before and/or after the gas has been purified by the gas purification unit.

The apparatus may further comprise a vacuum system in connection with the chamber.

A gas pressure within the chamber (or antechamber) may be arranged to be an overpressure or an underpressure. This may alternatively be described as the apparatus being arranged to establish an overpressure or underpressure within the chamber (or antechamber).

The apparatus may further comprise an antechamber configured to be in selective connection with the chamber.

The gas circulation system, or chamber (e.g. via the inlet) may further comprise, or be in connection with, a source of gas. The gas may be helium, nitrogen, neon, argon, oxygen, hydrogen, or carbon dioxide.

The outlet may be, may comprise, or may be in connection with a restriction configured to restrict a flow of gas from (i.e. out of) the chamber.

According to an aspect, there is provided an imprint lithography method for use with an imprint lithography apparatus, the imprint lithography apparatus comprising: an imprint template arrangement for use in imprinting a pattern into a substrate provided with imprintable medium; a substrate holder configured to hold the substrate; and a chamber having an inlet to allow gas to flow into the chamber and an outlet to allow gas to flow out of the chamber, wherein the imprint template arrangement and the substrate holder are located within the chamber, the chamber, in use, being arranged to contain a gaseous atmosphere; the method comprising: using the imprint template arrangement to imprint a pattern in the imprintable medium, when the imprint template arrangement, substrate and imprintable medium are located in the gaseous atmosphere contained by the chamber.

The gas used in the chamber and/or the gas circulation system may be a highly diffusive gas. The highly diffusive gas may be, for example, helium, nitrogen, neon, argon, oxygen, hydrogen, or carbon dioxide. Helium is particularly advantageous, since helium is highly diffusive and yet is not highly reactive (as is the case with, for example, hydrogen).

The imprint template arrangement may be an imprint template, an imprint template holder (that may hold an imprint template), or an imprint template holder that is holding an imprint template.

BRIEF DESCRIPTION OF THE DRAWINGS

Specific embodiments of the invention will be described with reference to the accompanying Figures, in which.

DETAILED DESCRIPTION

Figure 1A:
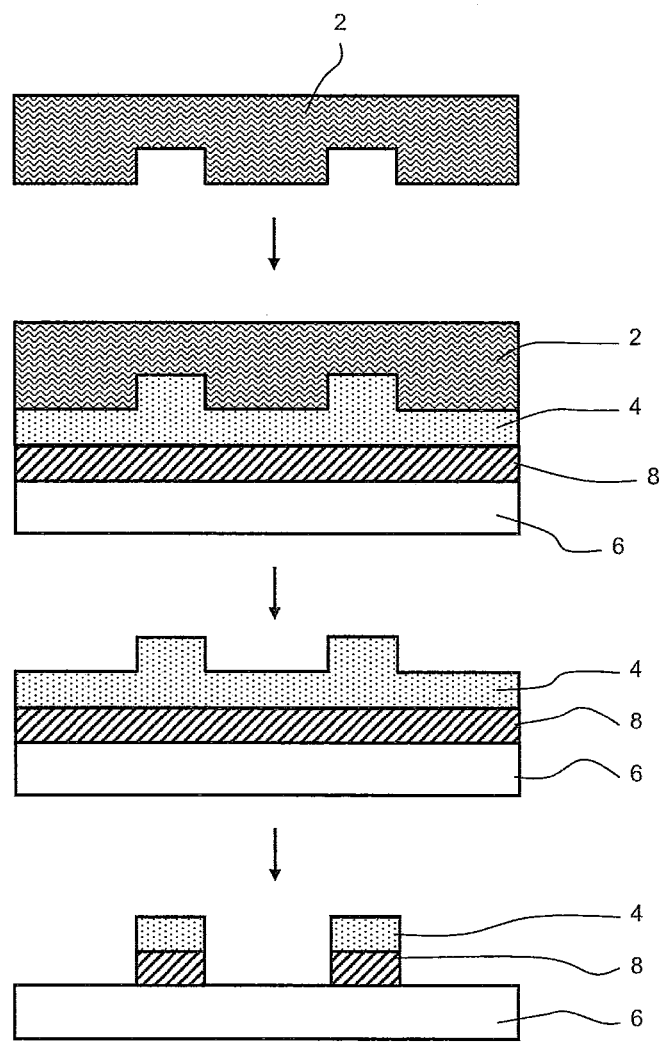
FIGS. 1a and 1b schematically depict examples of, respectively, hot imprint, and UV imprint lithography.
Figure 1B:
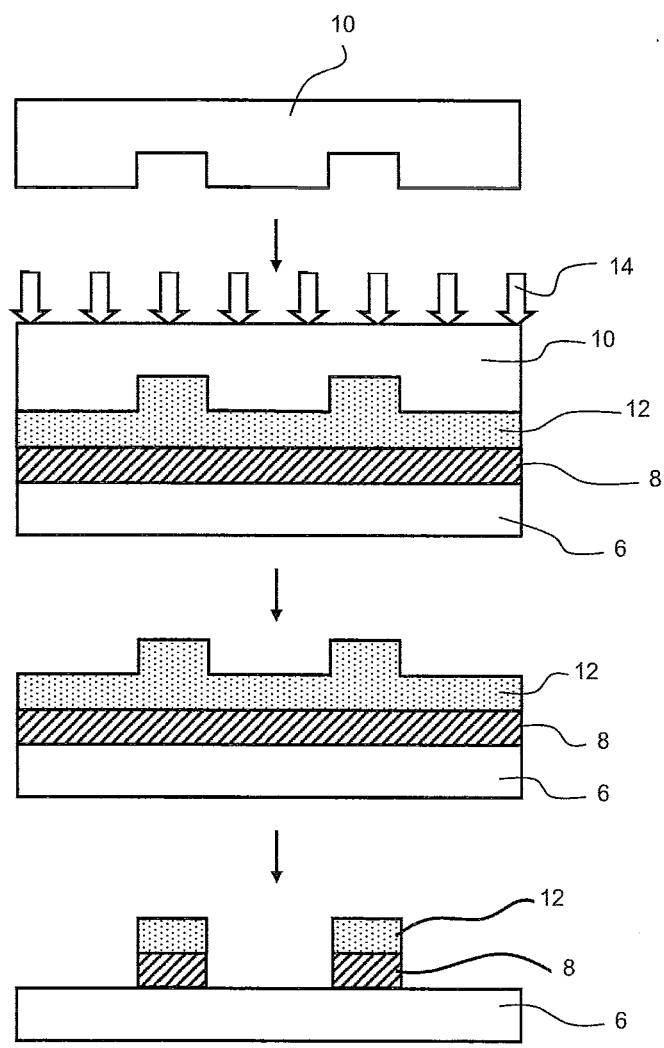

Examples of two known approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may, for example, be resin. The resin may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template contacts the flowable resin and then the resin is cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than the thermosetting or thermoplastic resin used in hot imprint lithography and consequently may move much faster to fill template pattern features. A quartz template 10 is applied to a UV-curable imprintable medium 12 in a similar manner to the process of FIG. 1a. However, instead of using heat or temperature cycling as in hot imprint, the pattern is frozen by curing the imprintable medium with UV radiation 14 that is applied through the quartz template onto the imprintable medium. After removal of the template, the pattern will consist of the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. US 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. US 2005-0274693, which mentions a combination of heating and UV curing an imprintable medium.

The patterned region of the imprint template may comprise one or more features (e.g. pattern features, structures, recesses or the like) having one or more dimensions of the order of nanometers. The patterned region may comprise one or more features having a width of 1-100 nm and/or or a depth of 1-100 nm (e.g. a width and/or depth of 10-100 nm).

Figure 2:
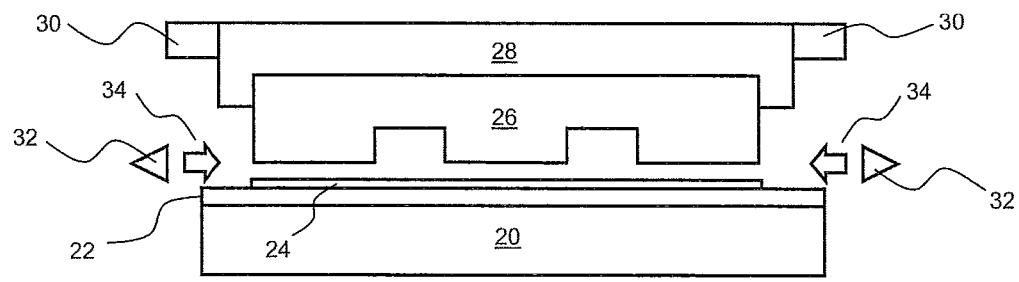
FIG. 2 schematically depicts a proposed apparatus and method for providing a gaseous atmosphere for use in imprinting.

FIG. 2 schematically depicts an imprint lithography apparatus. The apparatus comprises a substrate holder 20. The substrate holder 20 holds a substrate 22. Provided on that substrate 22 is a layer of imprintable medium 24. The layer of imprintable medium 24 is depicted in the Figure as being continuous in nature, but the layer of imprintable medium 24 could instead comprise of, for example, a plurality of droplets or the like.

The imprint lithography apparatus additionally comprises an imprint template 26 to imprint a pattern into the imprintable medium 24. The imprint template 26 is held by an imprint template holder 28. Movement of the imprint template 26 may be undertaken by appropriate movement of the imprint template holder 28. Movement of the imprint template holder 28 may be achieved by actuation of one or more actuators 30 which are in connection with the imprint template holder 28. In other embodiments, the actuator 30 may be connected to the imprint template 26, and there may be no need for an imprint template holder 28 (or the actuator 30 may serve as the imprint template holder). The actuator 30, or one or more other actuators, may alternatively or additionally be used to hold, position or deform the imprint template 26.

Generally speaking, an imprint template arrangement is used to imprint a pattern into an imprintable medium. The imprint template arrangement may be an imprint template, an imprint template holder capable of holding an imprint template, or an imprint template holder that is (e.g. in use) holding an imprint template.

As discussed previously, it is sometimes desirable to imprint an imprint template into imprintable medium in a gaseous atmosphere. The gaseous atmosphere may comprise highly diffusive gas, such as helium. FIG. 2 schematically depicts two gas outlets 32 which are configured to direct highly diffusive gas 34, such as helium, in-between and/or in the vicinity of the imprintable medium 24 and the imprint template 26. When the imprint template 26 is imprinted into the imprintable medium 24, any gas pockets formed between the imprint template 26 and the imprintable medium 24 comprise (at least partially) of highly diffusive gas. Because the gas pockets comprise highly diffusive gas, the pockets dissolve more rapidly than if the gas pockets were formed from a less diffusive gas. The more rapid diffusion of the gas pockets may result in a reduction or elimination of defects formed from the formation of such gas pockets in a pattern formed in the imprintable medium. It also results in a reduction of the time required for the droplets of imprintable medium (if used) to form a continuous layer, and thus enhances throughput.

Although the arrangement schematically depicted in FIG. 2 is able to provide a gaseous atmosphere in which imprinting may take place, there are one or more problems associated with the operation and principles of the apparatus depicted. One problem is that the outlet that is configured to direct a flow of highly diffusive gas over and across the layer of imprintable medium 24. This flow of gas results in an increase in the rate of evaporation of the imprintable medium 24. For instance, parts of the layer of imprintable medium 24 may evaporate altogether. Such total evaporation may occur, for instance, if the layer of imprintable medium 24 is formed from droplets of imprintable medium 24, each droplet having a volume of less than 10 pl. It is noted that, for example, the evaporation rate increases with decreasing droplet volume. Alternatively or additionally, the evaporation might change the chemical composition of the layer of imprintable medium 24, due to different vapor pressures of various components of the imprintable medium (for example, monomers, crosslinker, and the like). A further problem associated with the use of the apparatus shown in FIG. 2 is that the highly diffusive gas is not and cannot be re-used or recycled by any means, because of the mixing and diluting of the gas with any ambient surrounding gas (e.g. air). Furthermore, a highly diffusive gas such as helium is expensive. Continuous use of the imprint lithography apparatus requires continuous provision of the highly diffusive gas. Since the highly diffusive gas cannot be re-used or recycled, the running costs of the imprint lithography apparatus are higher, and this results in an increase in the costs of each substrate patterned by the imprint lithography apparatus.

It is desirable to overcome one or more of the above-mentioned problems, or one or more problems not identified herein.

According to an embodiment of the present invention, a new imprint lithography apparatus is provided. The imprint lithography apparatus comprises an imprint template arrangement for use in imprinting a pattern into a substrate provided with an amount of imprintable medium. The imprint template arrangement may be an imprint template, an imprint template holder provided with an imprint template, or an imprint template holder that is capable of holding an imprint template (and which, in use, holds an imprint template). Movement, holding, or deformation of the imprint template can be undertaken directly, or by appropriate holding, movement or deformation of the imprint template holder. The amount of imprintable medium may be, for example, a layer of imprintable medium which is provided in a continuous manner (e.g. by spin coating or the like), or desirably by using one or more droplets of imprintable medium (e.g. by ink jet deposition or the like). The imprint lithography apparatus further comprises a substrate holder to hold the substrate. A chamber is also provided. The imprint template arrangement and substrate holder are located within the chamber. The chamber, in use, is arranged to contain a gaseous atmosphere (for example, comprising only a single gas, which may be a highly diffusive gas, such as helium, nitrogen, neon, argon, oxygen, hydrogen, or carbon dioxide). The chamber is provided with an inlet to allow gas to flow into the chamber, and an outlet to allow gas to flow out of the chamber. The chamber forms part of a gas circulation system. The inlet and outlet of the chamber are connected to further components of the gas circulation system. The further components of the gas circulation system comprise a gas circulation driver configured to drive gas around the gas circulation system. For instance, the gas circulation driver may comprise or be a pump or the like. The gas circulation system also comprises a gas purification unit configured to purify gas as the gas is driven around the gas circulation system. The gas may be passed through the gas purification unit, or a part of the gas purification unit may be in contact with the gas, in order to purify the gas.

An advantage of an imprint lithography apparatus according to an embodiment of the present invention is that gas is re-circulated and purified, thereby reducing the amount of gas that may be required during the long-term operation of the imprint lithography apparatus. Furthermore, since the chamber is arranged to contain the gaseous atmosphere, there is no need to provide a flow of gas immediately before imprinting takes place. This means that the rate of flow of gas across the imprintable medium may be reduced, and may be negligible, obviating or mitigating the problem associated with the evaporation of the imprintable medium caused by the flow of gas.

Specific embodiments of the present invention will now described, by way of example only, with reference to FIGS. 3 to 7.

Figure 3:
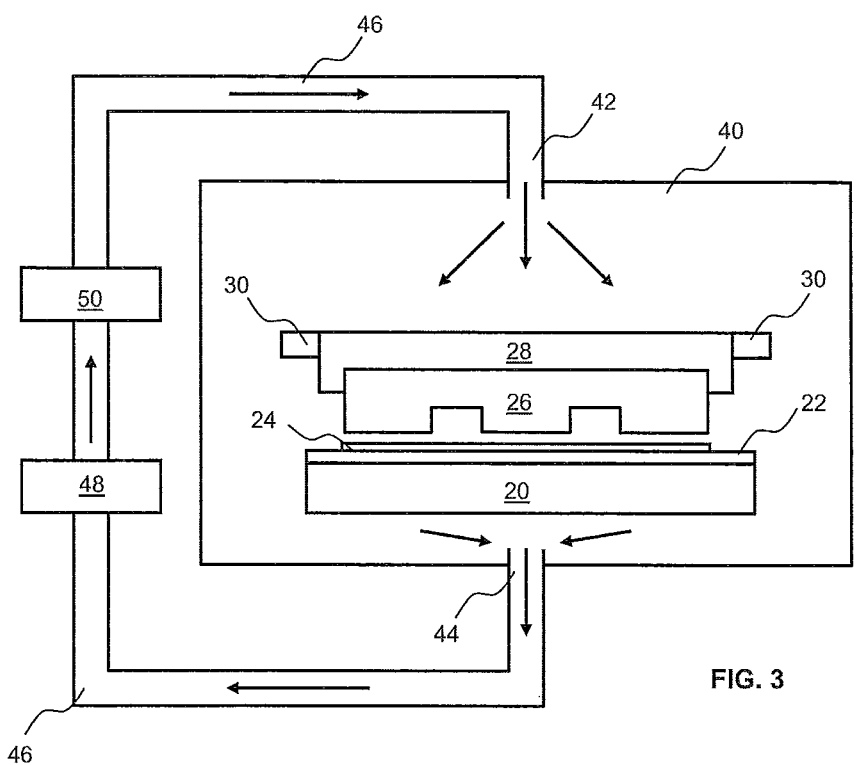
FIG. 3 schematically depicts an imprint lithography apparatus to provide a gaseous atmosphere in which imprinting is to take place, in accordance with an embodiment of the present invention.

FIG. 3 schematically depicts an imprint lithography apparatus. The apparatus comprises a substrate holder 20. The substrate holder 20 holds in position a substrate 22. Provided on that substrate 22 is a layer of imprintable medium 24. The layer of imprintable medium 24 is depicted in the Figure as being continuous in nature, but the layer of imprintable medium 24 could instead comprise, for example, of a plurality of droplets or the like.

The imprint lithography apparatus further comprises an imprint template 26 configured to imprint a pattern into the imprintable medium 24. The imprint template 26 is held by an imprint template holder 28. Movement of the imprint template 26 may be undertaken by appropriate movement of the imprint template holder 28. Movement of the imprint template holder 28 can be achieved by actuation of one or more actuators 30 which are in connection with the imprint template holder. In other embodiments, actuator 30 may be connected to the imprint template 26, and there may be no need for a separate imprint template holder 28. The actuator 30 may form an imprint template holder.

Generally speaking, an imprint template arrangement is used to imprint a pattern into imprintable medium. The imprint template arrangement may be an imprint template, an imprint template holder capable of holding an imprint template (and which, in use, holds an imprint template), or an imprint template holder that is holding an imprint template.

The imprint lithography apparatus also comprises a chamber 40. Located within the chamber 40 are the substrate holder 20, substrate 22, layer of imprintable medium 24, imprint template 26, imprint template holder 28, and actuator 30. In use, and as will be described in more detail below, the chamber is arranged to contain a gaseous atmosphere (for example, a helium, nitrogen, neon, argon, oxygen, hydrogen, or carbon dioxide gas atmosphere).

The chamber 40 has an inlet 42 that allows gas to flow into the chamber 40. The chamber 40 also has an outlet 44 that allows gas to flow out of the chamber 40. Gas flow is generally depicted in the Figure by way of arrows.

In this embodiment, the chamber has a top and a bottom. For instance, the bottom of the chamber 40 may, in use, be located closer to a floor on which the lithography apparatus is placed. Contamination within the chamber 40 will, in use, preferentially fall to the bottom of the chamber under the influence of gravity. In this embodiment, the outlet 44 of the chamber 40 forms part of (or may be in connection with) the bottom of the chamber 40. This means that contamination falling to the bottom of the chamber 40 is preferentially removed from the chamber via the outlet 44 by gas flow within and out of the chamber through the outlet 44. The inlet 42 forms part of, or may be in connection with, a top of the chamber 40, thus facilitating a flow of gas from the top of the chamber 40 to the bottom of the chamber 40 and toward outlet 44, removing contamination from the top to the bottom of the chamber 40.

The chamber 40 forms part of a gas circulation system. The inlet 42 and outlet 44 of the chamber 40 are connected to further components of the gas circulation system by way of conduits 46 or the like. The conduits 46 connect the chamber 40 to a gas circulation driver 48 which is used to drive gas around the gas circulation system, and thus through the chamber 40. The gas circulation driver 48 may be any apparatus suitable to drive gas around the gas circulation system, and may, for instance, be or comprise a pump or the like.

A gas purification unit 50 is provided to purify the gas as the gas is driven around the gas circulation system. Purifying may involve the removal of debris, removal of one or more organic vapors or solvents (for example, originating from the layer of imprintable medium 24), water, and/or any number of other gases (e.g. $N_2$, $O_2$, $CO_2$, in the case of helium being the gas used to form the gaseous atmosphere). This purification may be achieved using one or more dedicated filters (for example, active carbon) or one or more purifying techniques such as physical adsorption (for example, using a molecular sieve), chemical adsorption (for example, using a heated metal surface like, copper, nickel, zirconium or vanadium), a catalytic oxidation process or liquefaction. A purification unit which meets one or more of these requirements is known. For example, a purification unit known as the "MegaTorr PS5 Rare Gas Purifier", provided by the company Rainer Lammertz (Germany), is suitable.

In use, a gaseous atmosphere is provided within and contained by the chamber 40. The chamber 40 and the gas circulation system are sealed to prevent the ingress of gas (e.g. air) from the environment in which the imprint lithography apparatus is located. Such sealing helps to maintain the purity of the highly diffusive gas used in the imprint lithography process.

Before, after or during the provision of the highly diffusive gas in the chamber 40, the imprint template 26 and substrate 22 provided with the layer of imprintable medium 24 may be located within the chamber 40. The gas circulation driver 48 may continuously operate to drive gas through or via the gas purification unit 50 using conduits 46 and into and through the chamber 40. The gas within the chamber 40 is thus being constantly re-circulated and purified. The constant recirculation and purification of the gas results in a reduction in overall gas use in comparison with continuous new supply of gas of the proposed imprint lithography apparatus of FIG. 2. Furthermore, since chamber 40 contains a gaseous atmosphere, there is no need to quickly and suddenly provide a short-term gaseous atmosphere in the vicinity of the imprintable medium 24 and imprint template 26 before an imprint takes place, as is the case in the proposed imprint lithography apparatus of FIG. 2. Thus, because the chamber 40 contains a gaseous atmosphere, there is no need to provide a high flow rate of gas, and thus the flow rate can be reduced or minimized in order to reduce evaporation of the imprintable medium 24. For instance, the flow rate of helium gas through the chamber may be 0-500 $m^3$/hr.

The gas pressure within the chamber 40 may an overpressure (i.e. higher than atmospheric pressure) to help ensure that contamination is desirably prevented from entering the chamber 40. A typical pressure may be in the range of 1 to 1.5 bar. The gas pressure within the chamber 40 may alternatively be an underpressure (i.e. lower than atmospheric pressure), which may be advantageous, since it may reduce the amount of gas in the gas pockets and increases the rate of diffusion. A typical underpressure may be in the range of 1 mbar to 1 bar. The pressure within the chamber 40 may be controlled (for example, using the gas driving arrangement) and may be selectively a certain pressure, such as an overpressure or an underpressure. The pressure may be an overpressure when the chamber is being filled or refreshed with gas, and may be an underpressure when an imprint is taking place. The gas circulation driver 48 (or another arrangement, such as a pump or vacuum system) may be used to create the overpressure or underpressure.

Using the apparatus described in FIG. 3, an imprint process may be undertaken in an advantageous manner, avoiding one or more of the problems discussed above.

Additional embodiments of the present invention will now be described, by way of example only, with reference to FIGS. 4 to 7. The additional embodiments comprise improvements and/or modifications to the embodiment shown in and described with reference to FIG. 3. Thus, features appearing in FIG. 3 and subsequently described Figures are given the same reference numerals, with new features given new reference numerals where appropriate.

Figure 4:
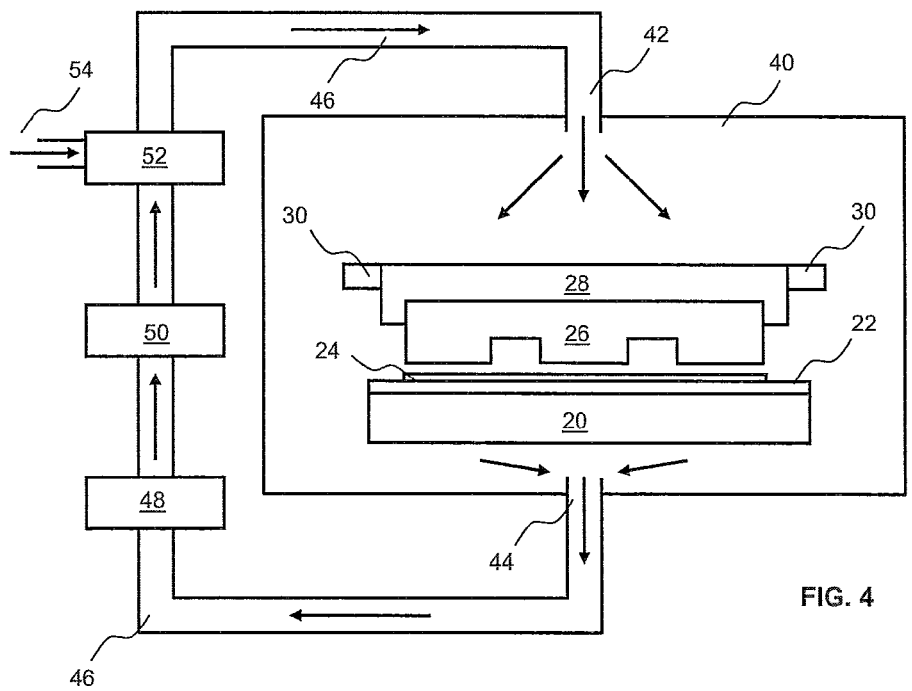
FIG. 4 schematically depicts an imprint lithography apparatus to provide a gaseous atmosphere in which imprinting is to take place, in accordance with a further embodiment of the present invention.

FIG. 4 schematically depicts an imprint lithography apparatus according to a further embodiment of the present invention. The imprint lithography apparatus depicted is substantially the same as the apparatus shown in and described with reference to FIG. 3. In addition to the apparatus shown in FIG. 3, the apparatus shown in FIG. 4 comprises a source of gas 52, for example helium gas. The gas circulation system may comprise, or be in connection with the source of gas 52. The source of gas 52 may be fed by, or replenished by, an external source of gas 54, for example a tank or the like located outside the imprint lithography apparatus. The source of gas 52 may be used to compensate for any losses in the gas circulated around the gas circulation system. For instance, such losses may be attributable to one or more leaks in the gas circulation system, or losses incurred during the purification of the gas in the gas purification unit 50.

The source of gas 52 may be directly connected to one or more conduits 46 that form part of the gas circulation system. In other embodiments, the source of gas 52 may be, for example, in connection with the gas purification unit 50, or be located within the chamber 40. The source of gas 52 may be selectively activated to provide a desired amount of gas into the chamber 40 or gas circulation system in general, in order to maintain a certain pressure or flow rate of gas around the gas circulation system.

Figure 5:
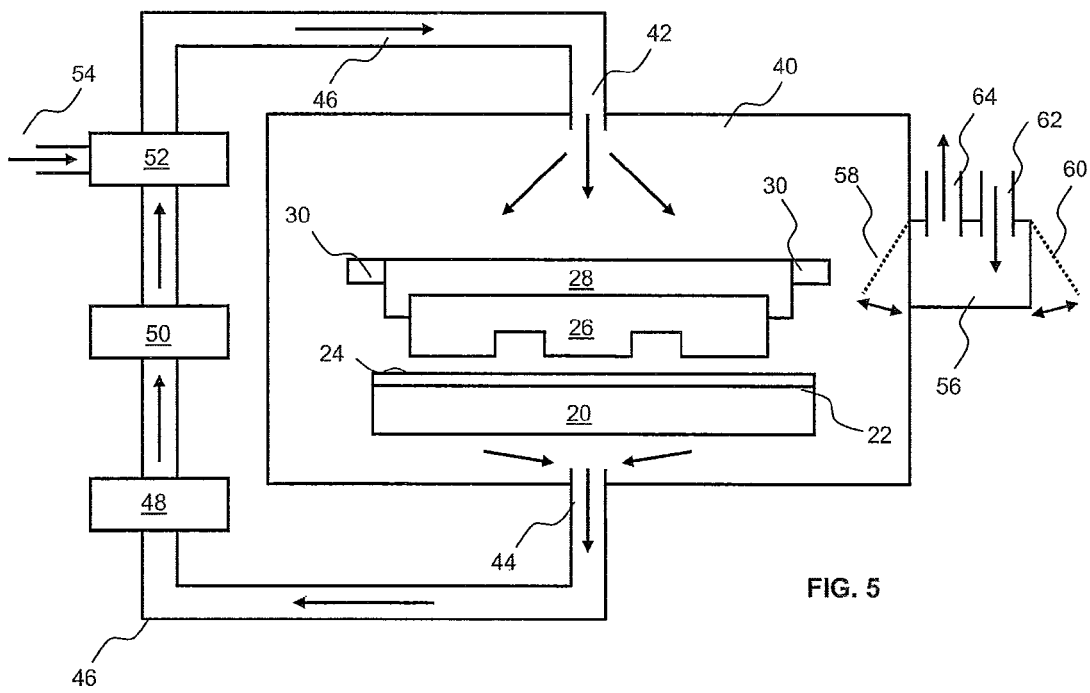
FIG. 5 schematically depicts an imprint lithography apparatus to provide a gaseous atmosphere in which imprinting is to take place, in accordance with a further embodiment of the present invention.

FIG. 5 schematically depicts an imprint lithography apparatus according to a further embodiment of the present invention. The imprint lithography apparatus is similar to the apparatus shown in and described with reference to FIG. 4. In addition to the apparatus shown in FIG. 4, the apparatus shown in FIG. 5 is additionally provided with an antechamber 56. The antechamber 56 is configured to be in selective connection with the chamber 40. The connection is such that one or more objects may pass or be passed from the antechamber 56 into the chamber 40, or from the chamber 40 into the antechamber 56. The selective connection may be achieved by way of a selectively actuable door 58 which separates the environment within the chamber 40 from the environment within the antechamber 56. The antechamber 56 may be provided with a further selectively actuable door 60. The further door 60 is selectively actuable to allow objects to be passed into the antechamber 56 from outside of the imprint lithography apparatus. Such objects may be, for example, an imprint template or a substrate or the like.

The antechamber 56 is further provided with a gas inlet 62 and a gas outlet 64. Gas, for example, helium gas, may be passed through the inlet 62 and into the antechamber 56. Gas may be removed from the chamber via the outlet 64 in order to maintain a gaseous atmosphere within the antechamber 56 and to, for example, maintain a specific flow rate or pressure of gas within the antechamber 56. Desirably the gas passed into the antechamber of 56 is the same as the gas used in the gas circulation system, of which the chamber 40 forms a part. This allows compatibility between the gases used in the chamber 40 and the antechamber 56, and facilitates any transfer of objects into the antechamber of 56 and subsequently into the chamber 40.

Figure 6:
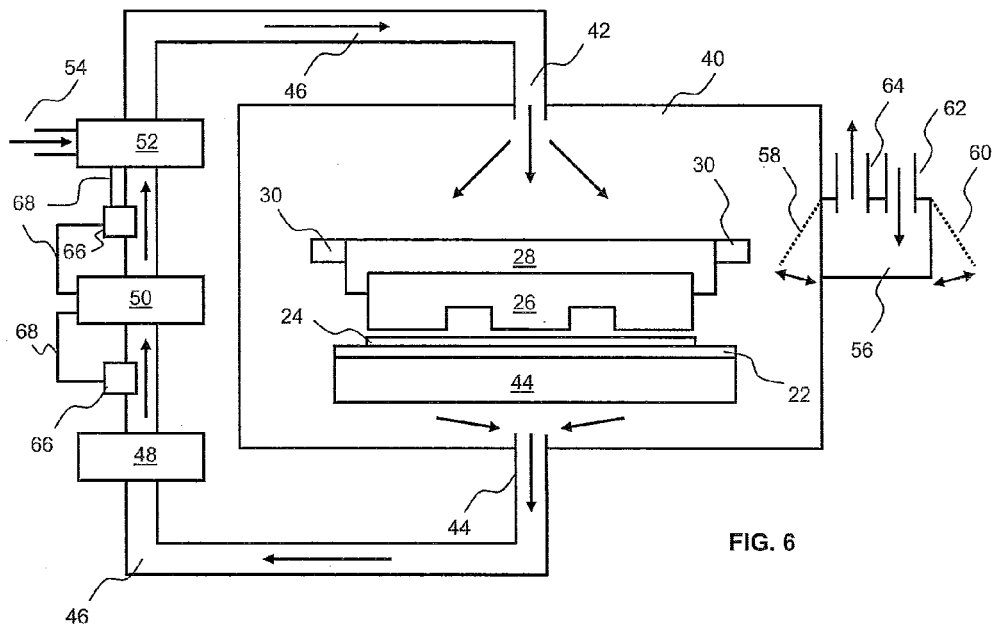
FIG. 6 schematically depicts an imprint lithography apparatus to provide a gaseous atmosphere in which imprinting is to take place, in accordance with a further embodiment of the present invention.

FIG. 6 schematically depicts a further embodiment of the present invention. The embodiment shown in FIG. 6 is similar to the embodiment shown in FIG. 5. However, in addition to the embodiment shown in FIG. 5, the embodiment shown in FIG. 6 comprises one or more sensors 66 to detect a property of the gas as the gas is circulated around the gas circulation system. The gas circulation system may comprise or be in connection with the sensor 66.

In one embodiment, as shown in the Figure, sensor 66 may be provided to detect a property of the gas before and after the gas has been purified by the gas purification unit 50. The sensor 66 may be in connection 68 (e.g. electrical connection) with the gas purification unit 50 and/or the source of gas 52. Depending on the nature of the detected property of the gas, certain actions may be taken by one or both of the gas purification unit 50 or source of gas 52. For instance, more gas may be added to the gas circulation system by the gas source 52. Alternatively or additionally, a higher or lower level of gas purification may be implemented by the gas purification unit 50.

The use of sensor 66 may make the gas circulation system more efficient, or alternatively or additionally more effective in providing a gaseous atmosphere within the chamber 40 at a desired flow rate or pressure. The sensor 66 may alternatively or additionally be connected to the gas circulation driver 48 to change the rate at which gas is driven around the gas circulation system.

In a further embodiment (not shown), one or more sensors may be in connection with a gas re-directing arrangement, such as a valve or moveable actuator or the like. If, for example, a sensor detects that gas passing through the gas purification unit has not been sufficiently purified, the gas re-directing arrangement may be actuated. The gas re-directing arrangement may, for example, re-direct gas along a conduit and back through the gas purification unit. This may be achieved by the movement of an actuator, or the opening or closing of a valve, which results in gas flowing along the conduit and back through the gas purification unit.

Figure 7:
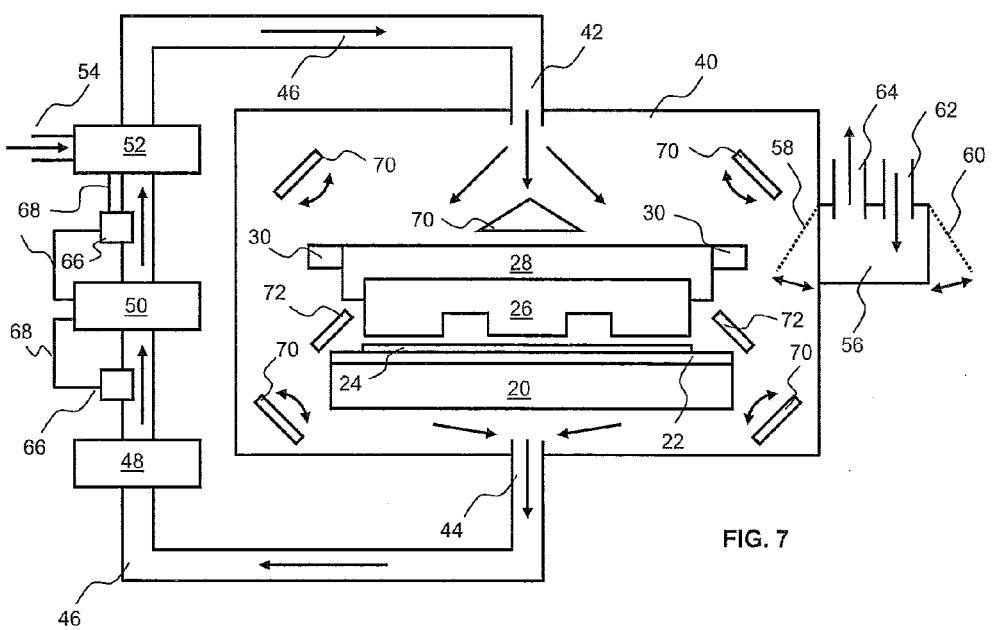
FIG. 7 schematically depicts an imprint lithography apparatus to provide a gaseous atmosphere in which imprinting is to take place, in accordance with a further embodiment of the present invention.

FIG. 7 schematically depicts an imprint lithography apparatus according to a further embodiment of the present invention. The lithography apparatus shown in FIG. 7 is similar to the apparatus shown in and described with reference to FIG. 6. However, in addition to the apparatus shown in FIG. 6, the lithography apparatus shown in FIG. 7 is provided with one or more guides 70 located within the chamber 40.

The guide 70 is used to guide the flow of gas within the chamber 40. For instance, one or more guides 70 may be used to guide a flow of gas into locations where contamination is known to be deposited, in order to move the contamination out through the outlet 44 of the chamber 40. In a further example, one or more guides 70 may be used to help ensure that gas flow within the chamber 40 has a certain profile, for example, a flow direction from a top of the chamber 40 to the bottom of the chamber 40. One or more guides 70 may alternatively or additionally be used to help ensure that gas is uniformly directed towards or between the imprintable medium 24 and the imprint template 26. In general, guide 70 may be used in any one or more of a number of ways to manipulate gas flow within the chamber 40. For additional flexibility, one or more guides 70 may be moveable so that the flow, or direction of flow of gas, within chamber 40 may be controlled with greater flexibility.

In addition to the guide 70, the chamber 40 is also provided with one or more shields 72. The shield 72 is used to shield the imprintable medium 24 from a flow of gas within the chamber 40. Shielding of the imprintable medium 24 from a flow of gas may reduce the evaporation of the imprintable medium, thereby obviating or mitigating a problem associated with such evaporation.

One or more shields 72 may be permanently fixed in position relative to the chamber 40. Alternatively or additionally, one or more shields 72 may be attached to the imprint template 26 or imprint template holder 28. One or more shields 72 may be moveable, such that the imprintable medium 24, or the location on the substrate 22 on which imprintable medium is to be deposited, can be selectively shielded from a flow of gas within the chamber 40. Such selective shielding may be advantageous. For instance, it may be desirable to help ensure that there is a flow of gas in-between the imprintable template 26 and substrate 22 immediately before imprintable medium 24 is deposited on a substrate 22. When the imprintable medium 24 has been deposited on the substrate 22, the shield 72 may be moved to shield the imprintable medium 24 from further flow of gas. This approach helps ensure that there is gas located between the imprintable medium 26 and the imprintable medium 24, thus improving the diffusion of gas pockets formed between the imprintable medium 26 and imprintable medium 24 during an imprint, while at the same time reducing the flow rate of gas and thus the evaporation of the imprintable medium.

In any one or more of the above embodiments, a plurality of chambers may be provided. The gas circulation system may be configured to circulate gas between different chambers of the plurality of chambers, for example into whichever chamber the gas is needed. This may be in addition to the circulation of gas within any one given chamber.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprint medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

In any one or more of the above embodiments, a vacuum system may additionally be provided. The vacuum system is configured to be able to selectively evacuate the chamber to a desired vacuum level, for example below 1 mbar. Such evacuation may be desirable if the chamber needs to be flushed. For instance, if the chamber has to be opened up for maintenance or the like, the chamber may need to be flushed with the highly diffusive gas that is used (e.g. helium). One way of making sure that the chamber is free (or substantially free) of other gases is to flush the chamber one or more times. A vacuum system in connection with the chamber can be used to perform such flushing.

In any one or more of the above embodiments, the inlet and outlet of the chamber may be closable. Closing the inlet and outlet may be desirable if, for example, the chamber is to be evacuated, or the chamber is to be opened up so that no other gases can flow into the conduits and other components (e.g. the gas purification unit, pump and the like) of the gas circulation system.

In the embodiments described above, the gas used has been described as a highly diffusive gas. The highly diffusive gas may be, for example, helium. Helium is particularly advantageous, since helium is highly diffusive and yet is not highly reactive (as is the case with, for example, hydrogen).

In the above embodiments, a gas circulation system has been described. The gas circulation system may be used to re-circulate gas, reducing the amount of gas that is used during one or more imprints. In some embodiments, there may be no need for a gas circulation system, or at least no desire for a gas circulation system. For instance, according to an embodiment of the present invention, there may be provided an imprint lithography apparatus which comprises: an imprint template arrangement for use in imprinting a pattern into a substrate provided with an amount of imprintable medium; a substrate holder configured to hold the substrate; and a chamber, the imprint template arrangement and the substrate holder being located within the chamber, the chamber, in use, being arranged to contain a gaseous atmosphere; the chamber having an inlet to allow gas to flow into the chamber, and an outlet to allow gas to flow out of the chamber. The outlet may restrict the flow of gas out of the chamber in order to, for example, restrict the flow rate of gas through the chamber, or alternatively or additionally to maintain an overpressure within the chamber. For example, the outlet may be, comprise or be in connection with a restriction, such as a gap between two bodies (such as two plates), or a hose or the like. The embodiment may comprise a source of gas in connection with the inlet. The inlet and outlet may be selectively opened and closed. This embodiment may comprise any one or more features of the embodiments described previously.

Even with no circulation system, this embodiment may be advantageous. For example, imprints may still be undertaken in a gaseous atmosphere without the need for a sudden high gas flow over the imprint medium, thus reducing problems associated with evaporation. A flow rate may be maintained, to remove contamination from the chamber.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography apparatus comprising:
an imprint template arrangement configured to imprint a pattern into an amount of imprintable medium provided to a surface of a substrate;
a substrate holder configured to hold the substrate; and
a chamber having an inlet to allow gas to flow into the chamber and an outlet to allow gas to flow out of the chamber, and the chamber having a top surface and a bottom surface, contamination within the chamber, in use, falling to the bottom surface of the chamber,
wherein the imprint template arrangement and the substrate holder are located within the chamber, the chamber, in use, being arranged to contain a gaseous atmosphere, and
wherein the outlet forms part of the bottom surface of the chamber and is spaced, in a direction perpendicular to the surface of the substrate, from and below a bottom of the substrate holder.

2. The apparatus of claim 1, wherein the chamber forms part of a gas circulation system, the inlet and outlet of the chamber being connected to further components of the gas circulation system, the further components of the gas circulation system comprising: a gas circulation driver configured to drive gas around the gas circulation system; and/or a gas purification unit configured to purify the gas as it circulates around the gas circulation system.

3. The apparatus of claim 1, wherein the chamber comprises a guide configured to guide a flow of gas within the chamber.

4. The apparatus of claim 1, wherein the chamber comprises a shield to at least partially shield the imprintable medium from a flow of gas.

5. The apparatus of claim 4, wherein the shield is moveable.

6. The apparatus of claim 2, wherein the gas circulation system comprises a gas purification unit configured to purify the gas as it circulates around the gas circulation system and comprises, or is in connection with, a sensor to detect a property of the gas before and/or after the gas has been purified by the gas purification unit.

7. The apparatus of claim 1, further comprising an antechamber configured to be in selective connection with the chamber.

8. The apparatus of claim 1, further comprising a vacuum system in connection with the chamber.

9. The apparatus of claim 1, wherein a gas pressure within the chamber is arranged to be an overpressure or an underpressure.

10. The apparatus of claim 1, wherein the chamber, or the gas circulation system further comprises, or is in connection with, a source of gas.

11. The apparatus of claim 1, wherein the outlet is, comprises, or is in connection with a restriction configured to restrict a flow of gas from the chamber.

12. The apparatus of claim 1, wherein the gas is helium, nitrogen, neon, argon, oxygen, hydrogen, or carbon dioxide.

13. The apparatus of claim 1, wherein the inlet is spaced, in a direction perpendicular to the surface of the substrate, from and above a surface of the imprint template arrangement facing the surface of the substrate.

14. The apparatus of claim 1, wherein the outlet is located underneath the substrate holder.

* * * * *